(12) United States Patent
Hofmann et al.

(10) Patent No.: US 8,470,612 B2
(45) Date of Patent: Jun. 25, 2013

(54) INTEGRATED CIRCUITS WITH MAGNETIC CORE INDUCTORS AND METHODS OF FABRICATIONS THEREOF

(75) Inventors: Renate Hofmann, Regensburg (DE); Carsten Ahrens, Pettendorf (DE); Wolfgang Klein, Zorneding (DE); Alexander Glas, Munich (DE)

(73) Assignee: Infineon Technologies AG, Neubiberg (DE)

( * ) Notice: Subject to any disclaimer, the term of this patent is extended or adjusted under 35 U.S.C. 154(b) by 138 days.

(21) Appl. No.: 12/900,277

(22) Filed: Oct. 7, 2010

(65) Prior Publication Data

US 2012/0086102 A1    Apr. 12, 2012

(51) Int. Cl.
    *H01L 27/22*    (2006.01)
(52) U.S. Cl.
    USPC ............... 438/3; 257/E39.325; 257/E21.502; 257/531
(58) Field of Classification Search
    USPC ............... 257/531, E29.325, E21.502; 438/3
    See application file for complete search history.

(56) References Cited

U.S. PATENT DOCUMENTS

| | | |
|---|---|---|
| 2,465,276 A | 3/1949 | Ryder |
| 5,547,599 A | 8/1996 | Wolfrey et al. |
| 5,821,846 A | 10/1998 | Leigh et al. |
| 6,191,468 B1 | 2/2001 | Forbes et al. |
| 6,287,931 B1 | 9/2001 | Chen |
| 6,338,900 B1 | 1/2002 | Tada et al. |
| 6,417,039 B2 | 7/2002 | Webster |
| 6,643,913 B2 | 11/2003 | Uchikoba et al. |
| 6,817,085 B2 | 11/2004 | Uchikoba et al. |
| 7,061,359 B2 | 6/2006 | Ding et al. |
| 7,271,693 B2 | 9/2007 | Ding et al. |
| 7,463,131 B1 | 12/2008 | Hwang et al. |
| 2006/0105496 A1* | 5/2006 | Chen et al. ............. 438/106 |
| 2009/0039999 A1* | 2/2009 | Fujii et al. .............. 336/200 |
| 2011/0233695 A1* | 9/2011 | Li et al. ................... 257/421 |
| 2011/0298088 A1* | 12/2011 | Elian et al. .............. 257/531 |

OTHER PUBLICATIONS

Yang, C., et al., "Ferrite-Integrated on-Chip RF Solenoid Inductor," IEEE, 2008, pp. 995-998.
Yang, C., et al., "On-Chip Soft-Ferrite-Integrated Inductors for RF IC," T2B.003, IEEE, 2009, pp. 785-788.

* cited by examiner

*Primary Examiner* — Marc Armand
(74) *Attorney, Agent, or Firm* — Slater & Matsil, L.L.P.

(57) ABSTRACT

In one embodiment, a method of forming a semiconductor device includes forming a first inductor coil within and/or over a substrate. The first inductor coil is formed adjacent a top side of the substrate. First trenches are formed within the substrate adjacent the first inductor coil. The first trenches are filled at least partially with a magnetic fill material. At least a first portion of the substrate underlying the first inductor coil is thinned. A backside magnetic layer is formed under the first portion of the substrate. The backside magnetic layer and the magnetic fill material form at least a part of a magnetic core region of the first inductor coil.

27 Claims, 23 Drawing Sheets

INTEGRATED CIRCUITS WITH MAGNETIC CORE INDUCTORS AND METHODS OF FABRICATIONS THEREOF

TECHNICAL FIELD

The present invention relates generally to semiconductor devices, and more particularly to integrated circuits with magnetic core inductors and methods of fabrications thereof.

BACKGROUND

Semiconductor devices are used in many electronic and other applications. Semiconductor devices comprise integrated circuits that are formed on semiconductor wafers by depositing many types of thin films of material over the semiconductor wafers, and patterning the thin films of material to form the integrated circuits.

Inductors are passive devices that are widely used in many applications. Integrated inductors are usually formed using conventional semiconductor processes. While improvements in performance of inductors are constantly sought, there is also a demand in semiconductor device technology to integrate many different functions on a single chip, e.g., manufacturing various types of active and passive devices on the same die.

As an example, ferrite bead inductors are used in many applications such as cellular phone or music players as electromagnetic interference (EMI) protection devices. Inductors are also used in DC/DC converters to smooth the voltage output and are manufactured as discrete SMD devices. However, there is an increasing demand for increasing the number of inductors, and hence there is a need to integrate inductors within the same package as the integrated circuits to be protected.

However, such integration creates additional challenges that need to be overcome. For example, conventional inductive structures require large surface areas or have limited magnetic performance. For aggressive integration, it is essential to have a low surface area along with a high quality factor.

In one aspect, the present invention provides a structure and method of forming inductors having high inductivity and low resistivity without a significant increase in production costs.

SUMMARY OF THE INVENTION

In accordance with an embodiment of the present invention, a method of forming a semiconductor device comprises forming a first inductor coil within and/or over a substrate. The first inductor coil is formed adjacent a top side of the substrate. First trenches are formed within the substrate adjacent the first inductor coil. The first trenches are filled at least partially with a magnetic fill material. At least a first portion of the substrate underlying the first inductor coil is thinned. A backside magnetic layer is formed under the first portion of the substrate. The backside magnetic layer and the magnetic fill material form at least a part of a magnetic core region of the first inductor coil.

In accordance with another embodiment of the present invention, a method of forming a semiconductor device comprises forming a first inductor coil within and/or over a substrate. The first inductor coil is formed adjacent a top side of the substrate. First trenches are formed within the substrate adjacent the first inductor coil. The first trenches are filled with a magnetic fill material. A carrier is attached to the top side of the substrate. The substrate and the first inductor coil are encapsulated with a magnetic mold compound.

In accordance with an embodiment of the present invention, semiconductor device comprises metal lines of a first inductor coil disposed within and/or over a substrate. The metal lines are disposed adjacent a top side of the substrate than an opposite back side. First trenches are disposed within the substrate adjacent the first inductor coil. A magnetic fill material fills the first trenches at least partially. A magnetic material is disposed under a first portion of the substrate. At least a part of a magnetic core region of the first inductor coil comprises the magnetic material and the magnetic fill material.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIG. 1, which includes

FIG. 2, which includes

FIG. 4, which includes

FIG. 5, which includes

FIG. 6, which includes

FIG. 7, which includes 7a-7d, illustrate alternative embodiment showing transformers after forming the trenches, wherein FIGS. 7a-7d correspond to the cross sectional view of FIG. 5a;

FIG. 8, which includes FIGS. 8a-8e, illustrates a cross sectional view after filling the trenches with a magnetic fill material, wherein FIGS. 8a and 8b illustrate inductors whereas FIGS. 8c-8e illustrate transformers;

FIG. 9, which includes FIGS. 9a-9g, illustrates the top view of the semiconductor device after filling the trenches with a magnetic fill material, wherein FIGS. 9a-9e illustrate top views that correspond to the cross sectional embodiment of FIG. 8*a*, and wherein FIG. 9*f*-9*g* illustrate top views that correspond to the cross sectional embodiment of FIG. 8*b*;

FIG. 10, which includes

FIG. 11, which includes FIGS. 11*a* and 11*b*, illustrate the next stage of processing illustrating cross sectional views of the semiconductor device after thinning the substrate, wherein FIG. 11*a* illustrates the embodiment wherein the magnetic fill material is formed adjacent and over, and wherein FIG. 11*b* illustrates the embodiment in which the inductor coils are embedded within the magnetic fill material;

FIG. 12, which includes

FIG. 13, which includes

FIG. 16, which includes FIG. 17, which includes

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to various embodiments in a specific context, namely semiconductor packages and integrated circuit chips having inductors. The invention may also be applied, however, to other types of devices having magnetic materials although not discussed herein.

Embodiments of the invention enable formation of high performance inductors along with other integrated circuits in a same chip and/or package.

A structural embodiment of the invention will be described first using FIG. 1. Further structural embodiments will be described with respect to FIG. 16. Various methods of fabrication of the semiconductor device will be described using FIGS. 2-15 and 17.

Figure 1A:
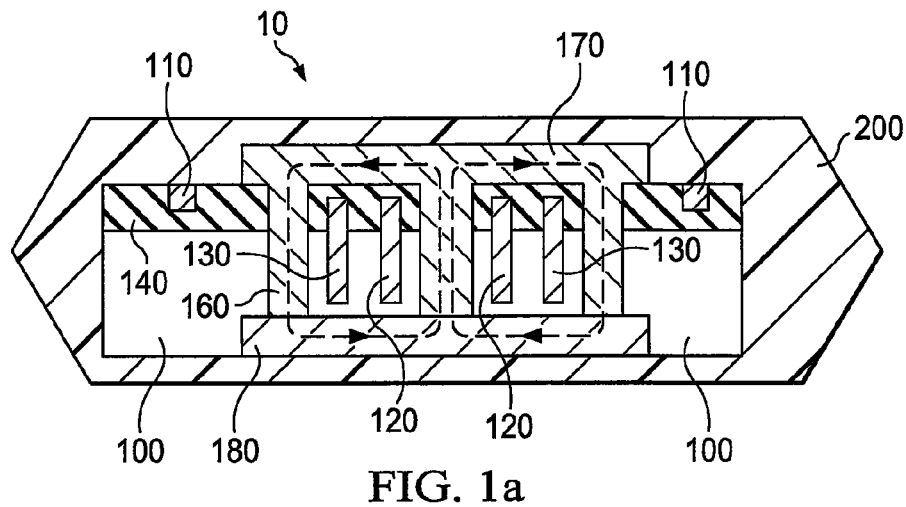
FIGS. 1a and 1b, illustrates a semiconductor device in accordance with an embodiment of the invention.
Figure 1B:
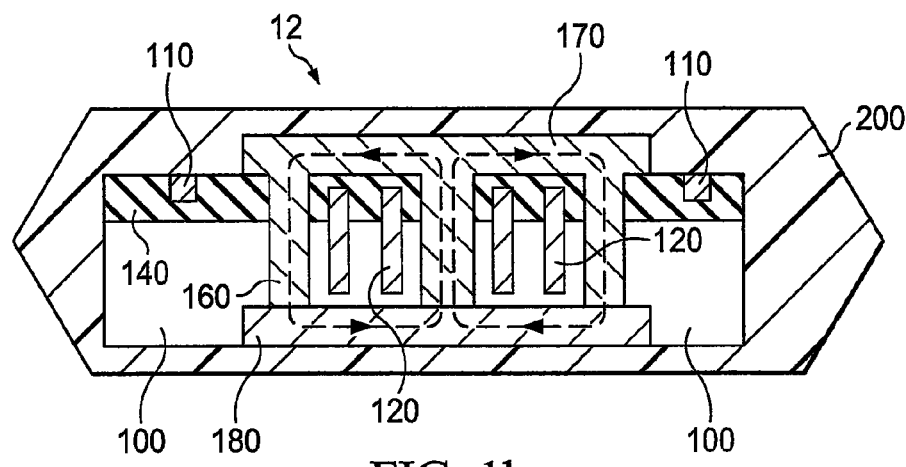

FIG. 1, which includes FIGS. 1*a* and 1*b*, illustrates a semiconductor device in accordance with an embodiment of the invention. FIG. 1*a* illustrates a transformer, whereas FIG. 1*b* illustrates a single inductor coil.

Referring to FIG. 1, a semiconductor chip is disposed within and over a substrate 100. The semiconductor chip may be an integrated circuit or a discrete device in various embodiments. The substrate 100 may include device regions or active circuitry, which can include transistors, diodes, resistors, capacitors, or other components used to form integrated circuits.

FIG. 1*a* illustrates a transformer 10 disposed within and/or above the substrate 100. The transformer 10 comprises a first inductor coil 120 and a second inductor coil 130. The first inductor coil 120 and the second inductor coil 130 may be disposed within the substrate 100 or may be partially or fully disposed within an insulating layer 140 over the substrate 100. In this embodiment the first inductor coil 120 and the second inductor coil 130 are wound around the core (middle trench). The insulating layer 140 may be a single layer or may comprise a plurality of sublayers in various embodiments. In one or more embodiments, the insulating layer 140 is an inter-level dielectric (ILD) material comprising metal lines and/or vias. The ILD material may be silicon oxide or other low dielectric constant materials known to one skilled in the art.

The first and the second inductor coil 120 and 130 are surrounded by trenches 160 filled with a magnetic fill material 170. The magnetic fill material 170 is also disposed over the first and the second inductor coils 120 and 130. In one or more embodiment, the magnetic fill material 170 comprises a ferromagnetic or ferrimagnetic material including MnZn ferrite, NiZn ferrite, NiFe ferrite, NiCuZn alloy, mu-metals, iron, nickel, and combinations thereof.

A backside magnetic layer 180 is disposed under a back surface of the substrate 100. In various embodiments, the backside magnetic layer 180 comprises a ferromagnetic or ferrimagnetic material including MnZn ferrite, NiZn ferrite, NiFe ferrite, NiCuZn alloy, mu-metals, iron, nickel, and combinations thereof. In one embodiment, the magnetic fill material 170 and the backside magnetic layer 180 are the same material. However, in various embodiments, the magnetic fill material 170 and the backside magnetic layer 180 are different materials because, for example; as they require different manufacturing requirements as will be described further below.

As illustrated in FIG. 1*a*, the backside magnetic layer 180 is formed primarily only under the first and the second inductor coils 120 and 130. Therefore, additional components (not shown) formed adjacent the transformer 10 do not have a backside magnetic layer 180 underlying them. Similarly, the magnetic fill material 170 is disposed primarily only over the first and the second inductor coils 120 and 130, so that additional components formed adjacent the transformer 10 are not impacted.

Together the magnetic fill material 170 and the backside magnetic layer 180 form the magnetic core of the first and the second inductor coils 120 and 130. Advantageously, the high magnetic permeability of the magnetic fill material 170 and the backside magnetic layer 180 causes concentration of the magnetic field lines (see arrows showing closed magnetic loop). The use of the magnetic core increases the inductance of the inductor by many multiples in various embodiments. The increased inductance helps to improve the quality factor which depends directly on the inductance.

In various embodiments, the transformer 10 can be contacted either from the top side of the substrate 100 (e.g., through contact pads). The illustrated embodiment shows a front side contact to the transformer 10 using contact pads 110.

The semiconductor chip comprising the transformer 10 is covered (encapsulated) by a mold material 200. In one embodiment, the mold material 200 comprises an epoxy-based molding compound.

In an alternative embodiment, the mold material 200 may further comprise magnetic particles. For example, ferromagnetic or ferrimagnetic particles including iron, nickel, MnZn ferrite, NiZn ferrite, NiFe ferrite, NiCuZn alloy, mu-metals, or combinations thereof may be disposed within the mold material 200.

In the illustrated embodiment, the mold material 200 is formed using injection molding in which a molding compound is injected into a mold cavity and cured to form the mold material encapsulating the substrate 100.

FIG. 1b illustrates an inductor 12 having multiple windings. In the illustrated example, the first inductor coil 120 comprises two windings.

FIGS. 2-15 illustrate methods of fabrication of a semiconductor device in accordance with embodiments of the invention.

The method will be described with cross sectional view of a semiconductor device during various stages of processing using FIGS. 2, 5, 8, 11-15. Corresponding (including alternative) top views of the semiconductor device will be described following the description of the cross sectional views for each stage of processing using FIGS. 3-4, 6-7, and 9-10.

FIG. 2, which includes FIGS. 2a-2g, illustrates a cross sectional view of an inductor coil after forming the metal lines of the coil in accordance with various structural embodiments. FIGS. 3 and 4 illustrate top views of the inductor or transformer coils in accordance with various structural embodiments.

Figure 2A:
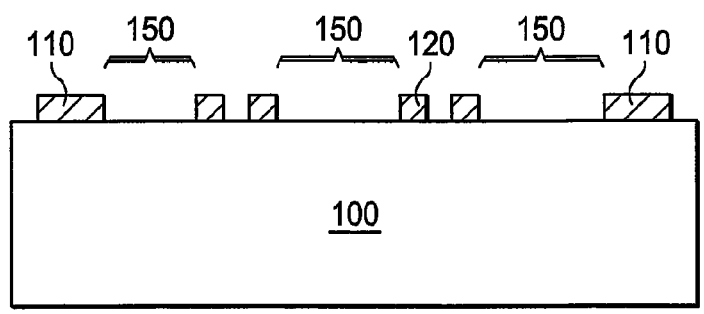
FIGS. 2a-2g, illustrates a cross sectional view of an inductor coil after forming the metal lines of the coil in accordance with various structural embodiments.
Figure 2B:
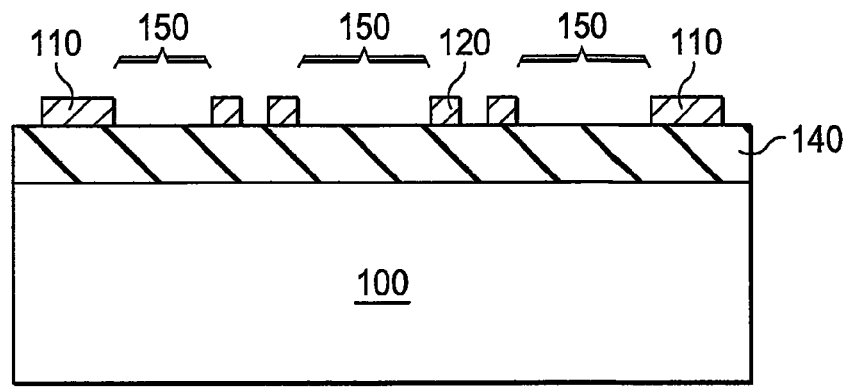
Figure 3:
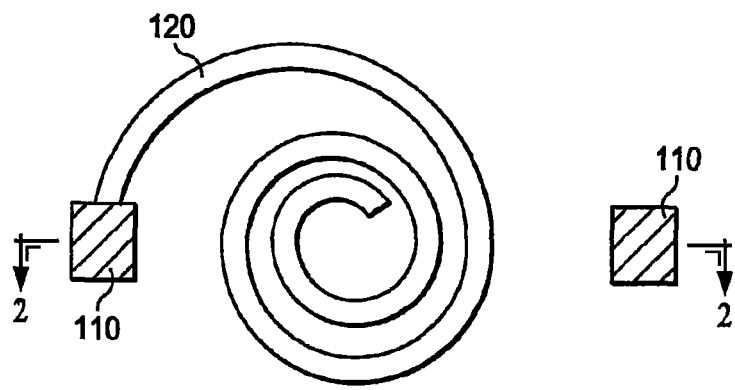
FIG. 3 illustrates a top view after forming the metal lines of the first inductor coil in accordance with an embodiment.

In various embodiments, the metal lines of the first inductor coil 120 may be formed above the substrate 100 as illustrated in FIG. 2a. Alternatively, as illustrated in FIG. 2b, the metal lines of the first inductor coil 120 may be formed above the substrate 100 and an insulating layer 140 that may include one or more metallization layers.

Figure 2C:
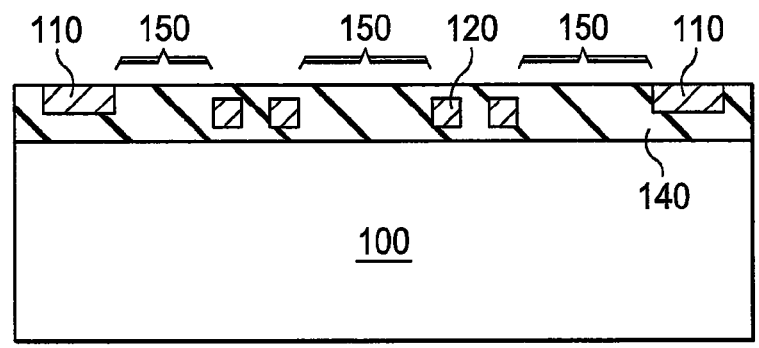

FIG. 2c illustrates a further alternative embodiment wherein the metal lines of the first inductor coil 120 are formed within an insulating layer 140. In such an embodiment, the first inductor coil 120 may be formed in a same metal level as interconnects for connecting other devices within the substrate 100. Therefore, no additional processing is necessary in forming the metal lines of the first inductor coil 120.

Figure 2D:
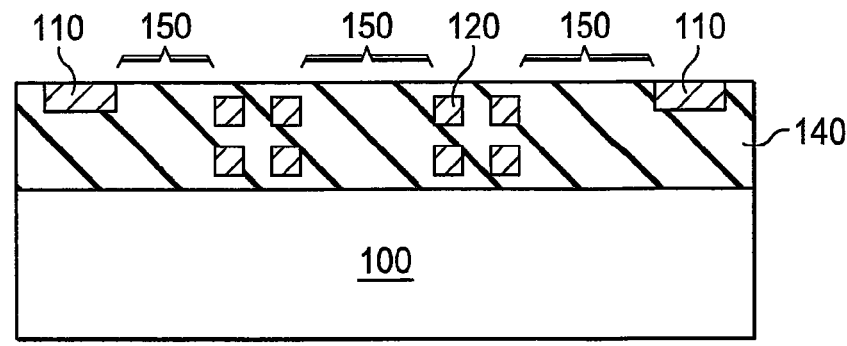
Figure 2E:
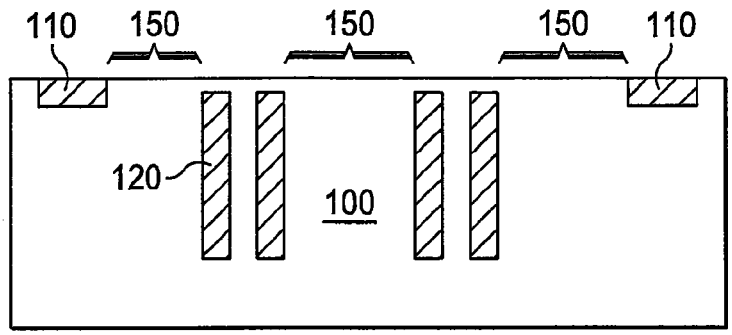

FIG. 2d illustrates an alternative embodiment in which the metal lines of the first inductor coil 120 are formed within a plurality of metal levels over the substrate. FIG. 2e illustrates another embodiment wherein the metal lines of the first inductor coil 120 are formed completely within the substrate 100 and are coupled through contact pads 110 formed within the substrate 100. For example, trenches may be formed within the substrate 100 and filled with a metal thereby forming the metal lines of the first inductor coil 120 within the substrate 100.

Figure 2F:
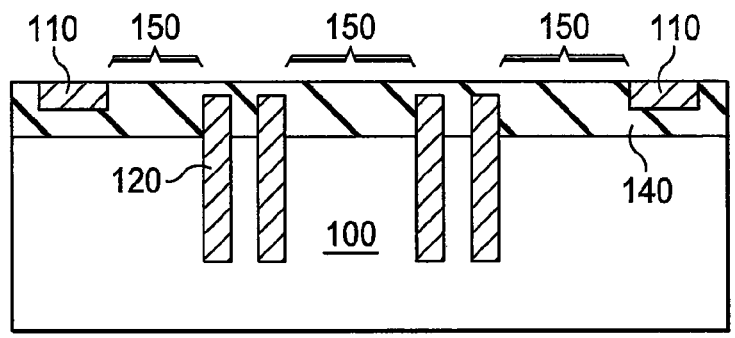
Figure 2G:
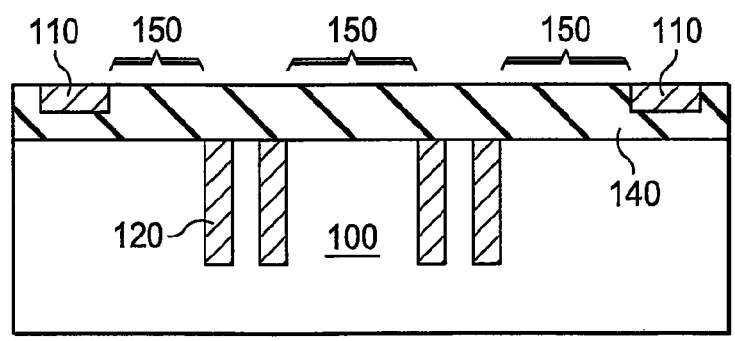

FIG. 2f illustrates an embodiment in which the metal lines of the first inductor coil 120 are formed within both an insulating layer 140 and the substrate 100. In FIG. 2g, the metal lines of the first inductor coil 120 are formed within the substrate and are coupled through contact pads 110 within an insulating layer 140.

FIG. 3 illustrates a top view of the first inductor coil 120 in accordance with an embodiment. In one embodiment, FIG. 3 may be a top view illustrating the metal lines of the first inductor coil 120 illustrated in FIG. 2. The first inductor coil 120 is formed as a spiral within a horizontal plane that is parallel to a top surface of the substrate 100.

As described with respect to FIG. 2, the metal lines of the first inductor coil 120 is formed using a damascene process or other trench fill process, and is disposed within a single metal level, multiple metal levels, and/or within the substrate. In one or more embodiments, on top of the substrate (as in FIG. 2a), the first inductor coil 120 can also be formed using pattern plating involving a lithography step and galvanic deposition of the metal lines.

The contact pads 110 may be formed in the same horizontal plane as the metal lines of the first inductor coil 120 or may be formed in higher planes above the first inductor coil 120.

FIG. 4, which includes FIGS. 4a-4e, illustrates alternative structural embodiments of the first inductor coil.

Figure 4A:
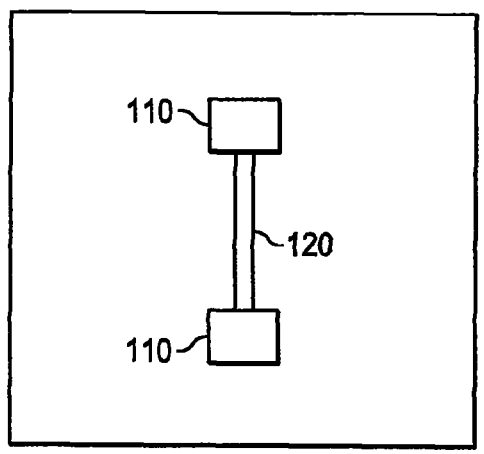
FIGS. 4a-4e, illustrates a top view after forming the metal lines of the first inductor coil in accordance with alternative structural embodiments.

Referring FIG. 4a, the first inductor coil 120 comprises a linear shape in one embodiment. In the embodiment illustrated in FIG. 4b, the first inductor coil 120 is circular.

Figure 4B:
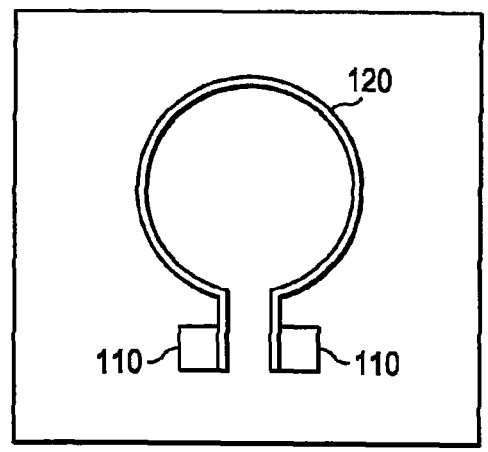
Figure 4C:
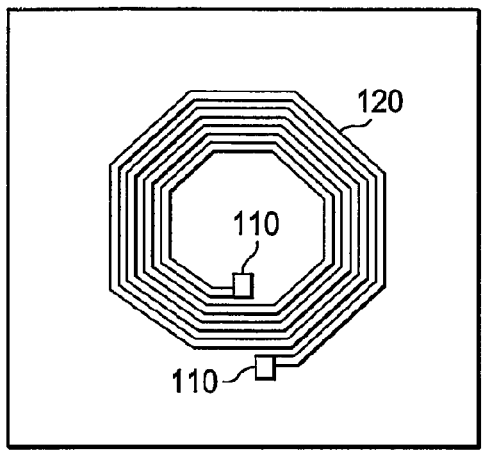

In an alternative embodiment of FIG. 4c, the first inductor coil 120 is concentric having, for example, an octagonal shape. In other embodiments, the concentric shape may have more or less number of sides.

Figure 4D:
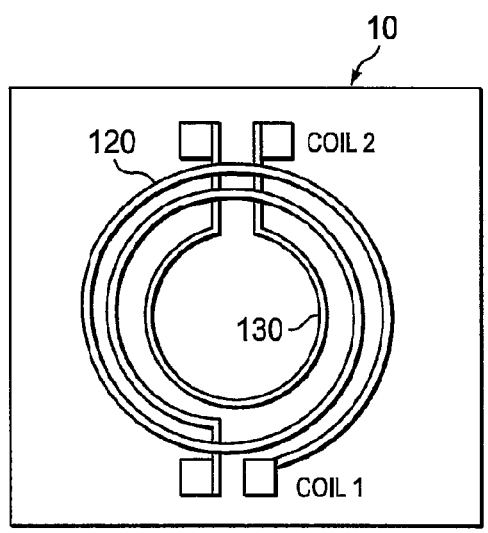
Figure 4E:
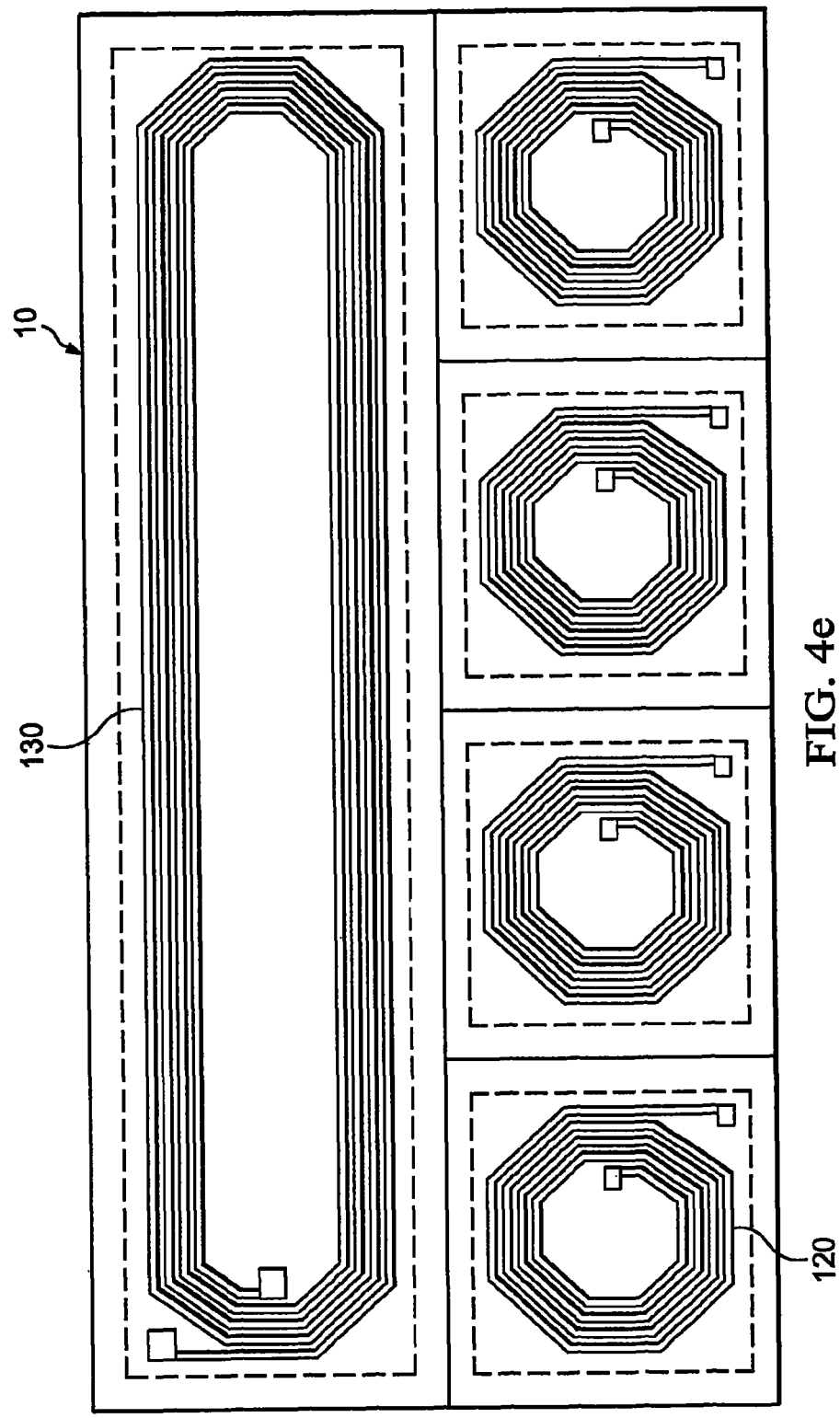

FIGS. 4d and 4e illustrate embodiments showing a transformer 10 having a first inductor coil 120 and a second inductor coil 130. In FIG. 4d, the first inductor coil 120 may be the primary coil connected to an input voltage node, while the second inductor coil 130 may be the secondary coil, which is coupled to an output voltage node. The ratio of the windings between the first and the second inductor coils 120 and 130 determines the output voltage of the transformer 10.

In FIG. 4e, the transformer 10 comprises a first inductor coil 120 and one or a plurality of second inductor coils 130. Each inductor coil of the plurality of second inductor coils 130 may comprise identical inductor coils (e.g., similar number of windings or may comprise different number of windings).

In various embodiments, other suitable shapes of the first inductor coil 120 and/or second inductor coil 130 may be used for forming the transformer 10.

FIG. 5 illustrates cross sectional views of the semiconductor device after forming trenches, and FIGS. 6 and 7 illustrate a corresponding top view.

Referring next to FIG. 5, trenches 160 are formed adjacent the first inductor coil 120 (and other coils such as the second inductor coil). The trenches 160 are formed using a lithography process followed by etching the substrate 100 and/or insulating layer 140 using, e.g., reactive ion etching. The depth of the trenches 160 may be about 10 μm to about 400 μm in various embodiments. In various embodiments, trenches 160 deeper than or almost the same as the thickness of the to be formed final substrate 100. In various embodiments, this is necessary to connect the magnetic filling of the trench with the magnetic backside thereby closing the magnetic loop. Alternatively, the depth of the trenches 160 may be selected to form a thin gap between the trench fill and back side magnetic materials. This thin gap behaves as "air gap" to tune the frequency dependence of the magnetic core.

For sake of clarity, the structures illustrated in FIGS. 2b-2g, are also not illustrated at subsequent processing steps, although various embodiments of the invention also include similar processing of these structures.

Figure 5A:
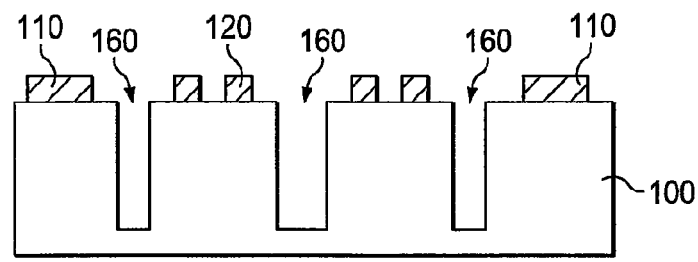
FIGS. 5a and 5b, illustrates cross sectional views of the semiconductor device after forming trenches in accordance with embodiments of the invention.

FIG. 5a, illustrates a first embodiment, wherein the etching is performed substantially vertically. In contrast, in an alternative embodiment illustrated in FIG. 5b, the etching is performed laterally as well thereby etching underneath the metal lines of the first inductor coil 120.

A corresponding top view of the structures at this stage of processing is illustrated in FIG. 6. FIGS. 6a-6d correspond to the cross sectional embodiment of FIG. 5a, whereas FIG. 6e-6f correspond to the cross sectional embodiment of FIG. 5b.

Figure 6A:
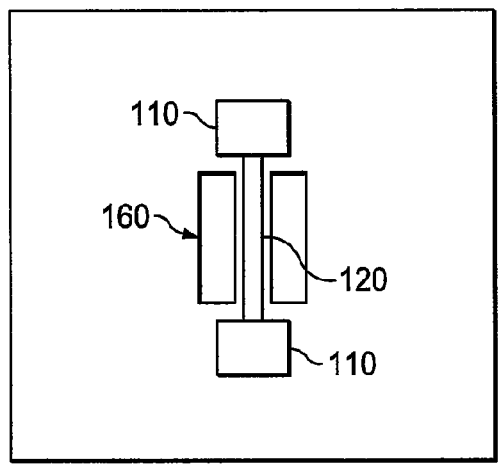
FIGS. 6a-6g, illustrates top views of the semiconductor device after forming trenches in accordance with embodiments of the invention, wherein FIGS. 6a-6e correspond to the cross sectional embodiment of FIG. 5a, and wherein FIGS. 6f-6g correspond to the cross sectional embodiment of FIG. 5b.
Figure 6B:
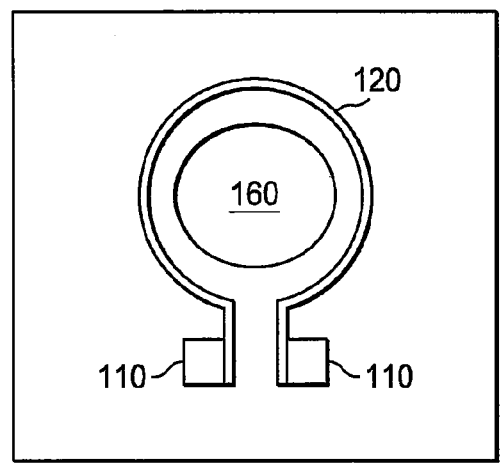

FIG. 6a illustrates the top view of the linear first inductor coil 120 as illustrated in FIG. 4a after forming trenches 160. The trenches 160 are formed adjacent the first inductor coil 120. FIG. 6b illustrates the top view of the circular first inductor coil 120 as illustrated in FIG. 4b after forming trenches 160.

Figure 6C:
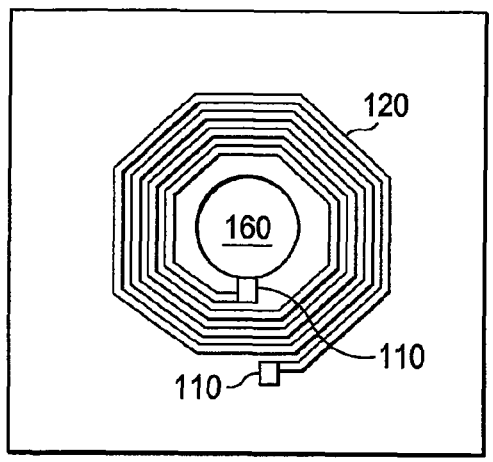
Figure 6D:
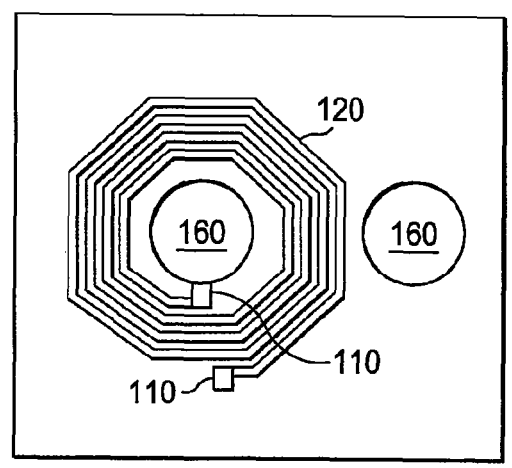
Figure 6E:
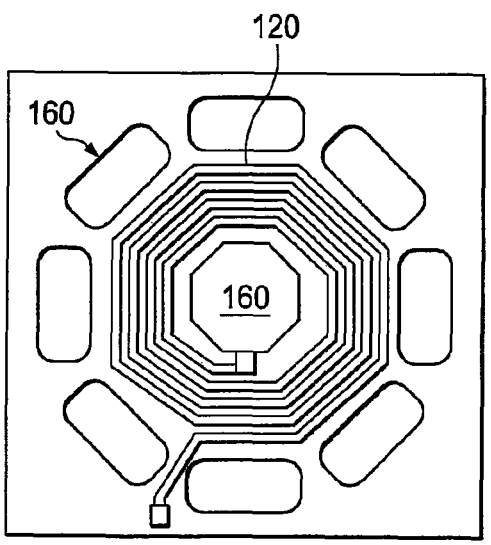

FIGS. 6c-6e illustrate top views of the concentric first inductor coil 120 as illustrated in FIG. 4c. In FIG. 6c, trenches 160 are formed only in a central region within the concentric first inductor coil 120, whereas in FIGS. 6d and 6e, trenches 160 are formed both in a central region and periphery regions surrounding the first inductor coil 120. In FIG. 6d, a single side trench 160 is formed having about the same area as the core inner trench 160. In FIG. 6e, eight side trenches 160 are formed because of the octahedral shape of the first inductor coil 120. In other embodiments, the number of side trenches 160 may be increased or decreased. In various embodiments, the area of the inner trench 160 (the magnetic core) has about the same area (in the top view) as the peripheral trench 160 or the areal sum of the peripheral trenches.

Figure 5B:
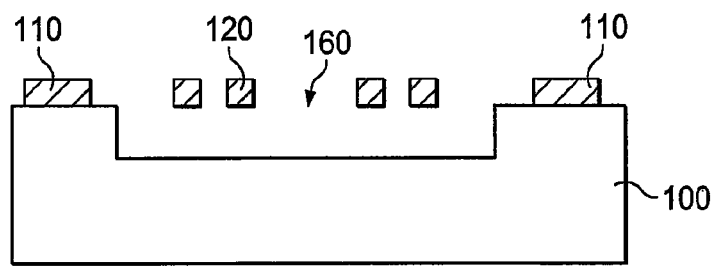
Figure 6F:
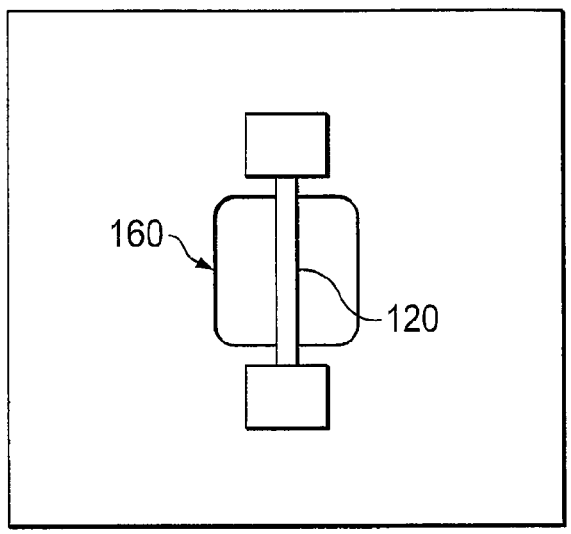
Figure 6G:
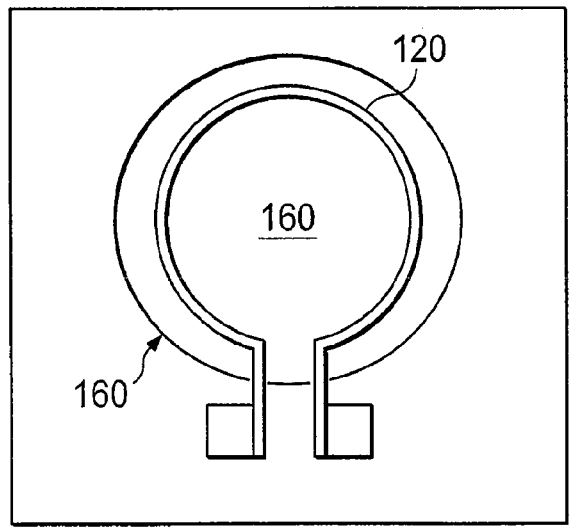
Figure 7A:
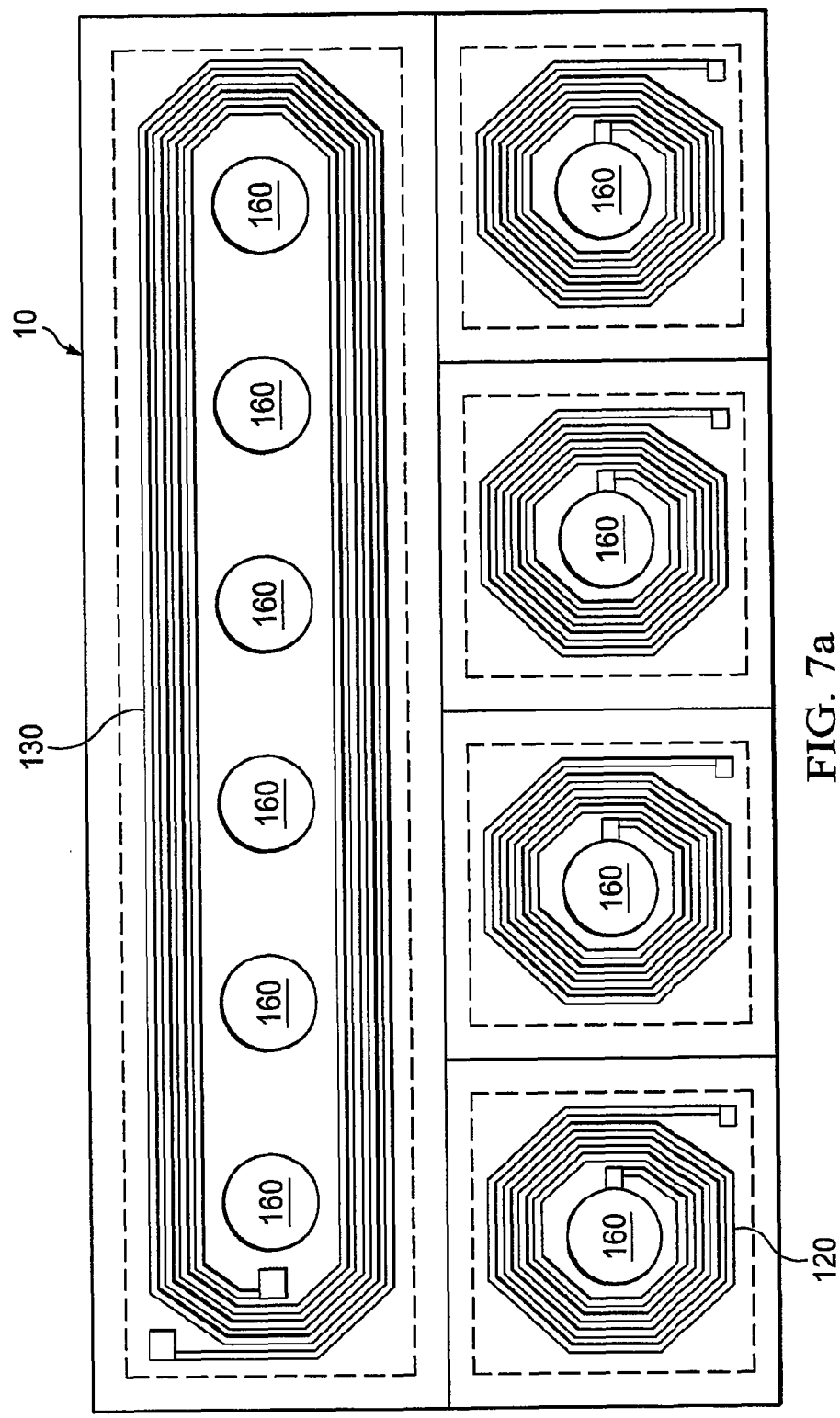
Figure 7B:
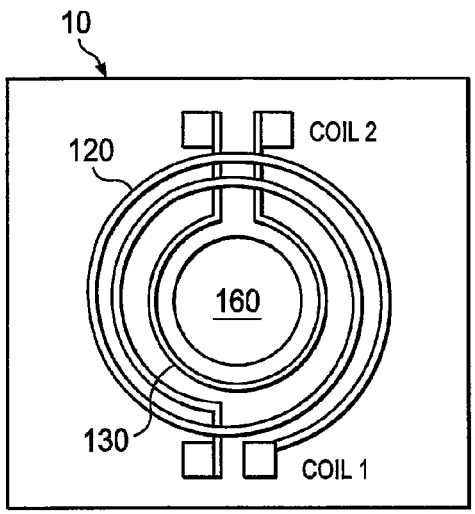
Figure 7C:
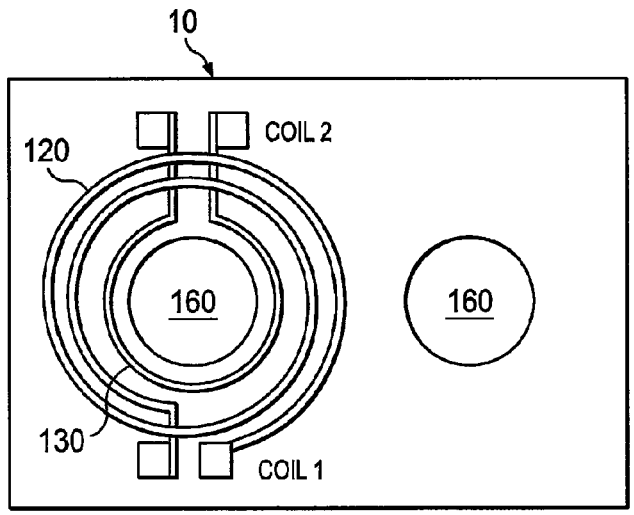
Figure 7D:
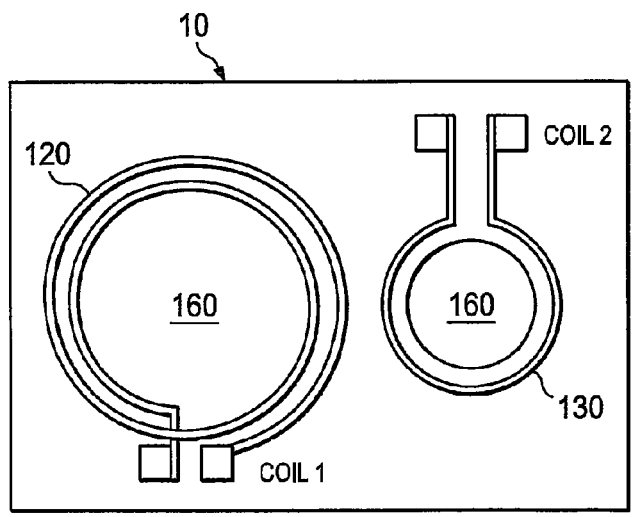

FIGS. 6f and 6g illustrate alternate embodiments of top views of the semiconductor device that correspond to the cross sectional view of FIG. 5b.

FIG. 6f illustrates a linear first inductor coil 120 that comprises a trench 160 that is formed both adjacent and below the metal line of the first inductor coil 120. FIG. 6g illustrates a circular first inductor coil 120 includes a trench 160 that is formed below the metal line of the first inductor coil 120.

FIG. 7, which includes 7a-7d, illustrate alternative embodiment showing top views of transformers after forming the trenches. FIGS. 7a-7d correspond to the cross sectional view of FIG. 5a. FIG. 7c illustrates an alternative embodiment with a peripheral trench 160. The peripheral trench 160 closes the magnetic loop locally. FIG. 7d illustrates an alternative embodiment of FIG. 7c wherein the first and the second inductor coils 120 and 130 are wound in a different configuration. For example, assuming a rectangular shaped closed core, in one embodiment, both the first and the second inductor coils 120 and 130 may be wound around one side of the rectangular core as illustrated in FIG. 7c. Alternatively, the first and the second inductor coils 120 and 130 may be wound around opposite sides of the rectangular core and the core transmits the magnetic field as illustrated in FIG. 7d.

Figure 8A:
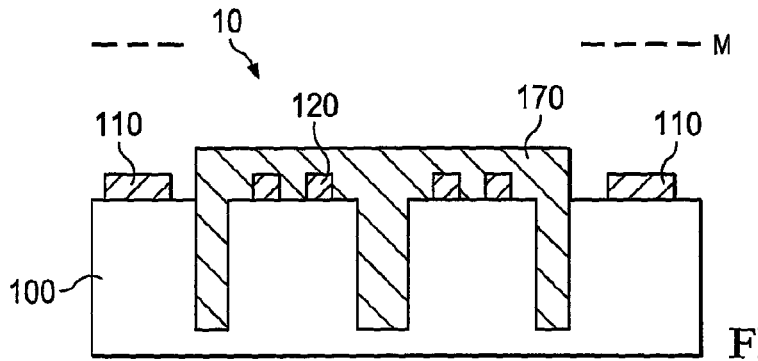
Figure 8B:
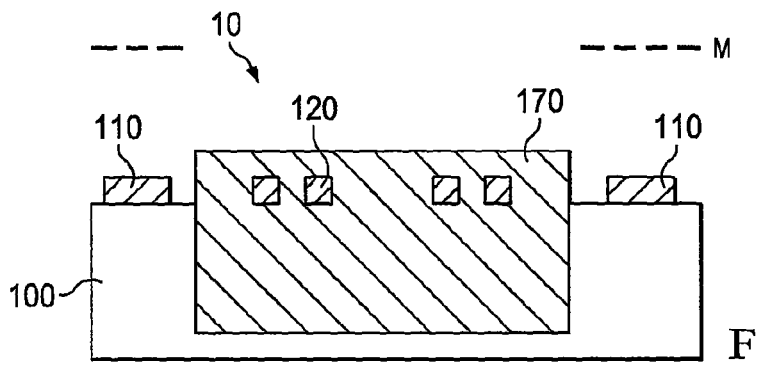
Figure 8C:
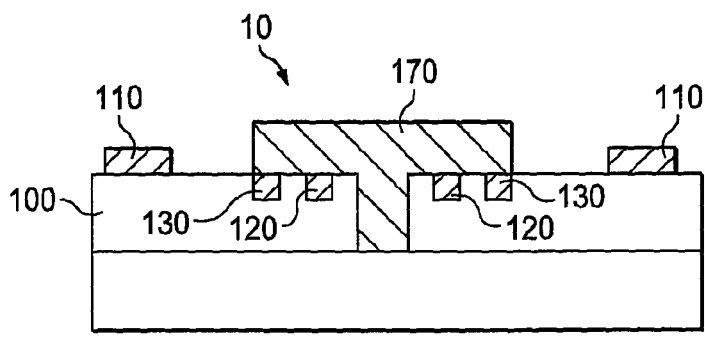
Figure 8D:
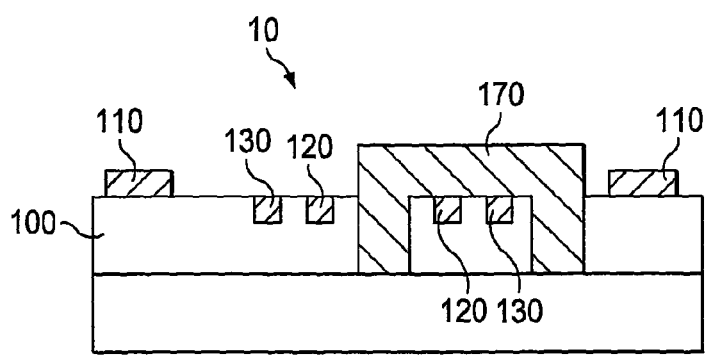
Figure 8E:
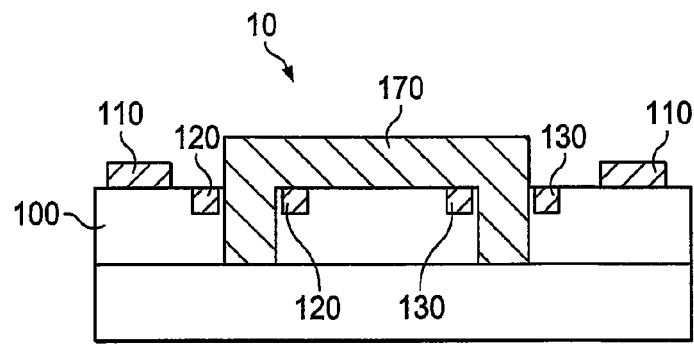

FIG. 8, which includes FIGS. 8a-8e, illustrates a cross sectional view after filling the trenches with a magnetic fill material. In FIG. 8, FIGS. 8a and 8b illustrate inductors, whereas FIGS. 8c-8e illustrate transformers. FIGS. 8c-8e illustrate the vertical etch embodiment illustrated for transformers for clarification. FIG. 9, which includes FIGS. 9a-9g, and FIG. 10, which includes FIGS. 10a-10d, illustrate corresponding top views of the semiconductor device after filling the trenches with a magnetic fill material. The top view of FIG. 8c is illustrated in FIG. 10b, the top view of FIG. 8d is illustrated in FIG. 10c, and the top view of FIG. 8e is illustrated in FIG. 10d.

The contact pads 110 and other circuitry (to be protected) is covered with a protective mask layer (not shown) corresponding to a mask M. In some embodiments, if a layout with one or more peripheral trenches 160 is used, the mask M can be used to apply the top magnetic material just locally to connect the inner core trench 160 and the peripheral trench 160 to form a locally closed magnetic loop. The protective mask layer may be formed using standard lithography processes. A magnetic fill material 170 is used to fill in the trenches 160. In one or more embodiment, the magnetic fill material 170 comprises a ferromagnetic or ferrimagnetic material including MnZn ferrite, NiZn ferrite, NiFe ferrite, NiCuZn alloy, mu-metals, iron, nickel, and combinations thereof.

In one embodiment, the magnetic fill material 170 may be spun-on. In other embodiments, the magnetic fill material 170 may be deposited. A subsequent planarization process may be used to planarize the surface of the magnetic fill material 170. Any remaining mask material may be removed.

In FIG. 8a, the magnetic fill material 170 is thereby formed adjacent and over the metal lines of the first inductor coil 120. In FIG. 8b, the magnetic fill material 170 is also formed under the first inductor coil 120, thereby embedding the first inductor coil 120 within the magnetic fill material 170.

Figure 9A:
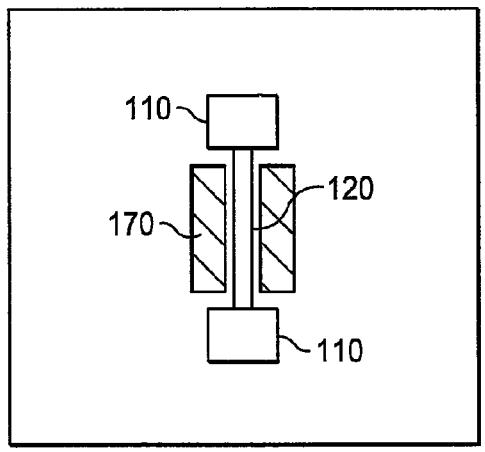
Figure 9B:
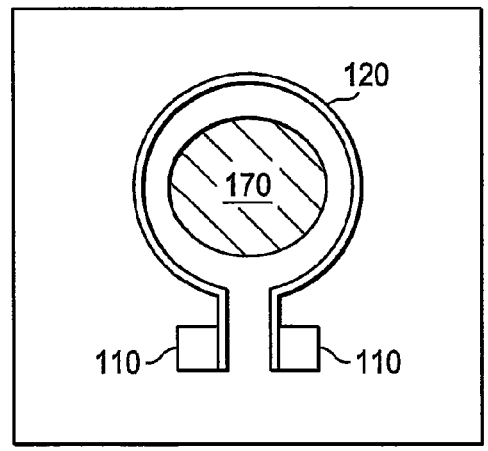
Figure 9C:
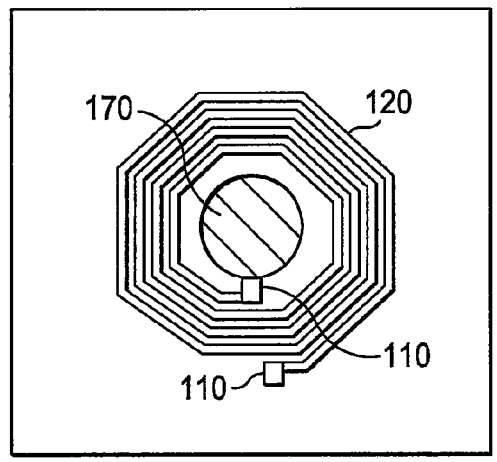
Figure 9D:
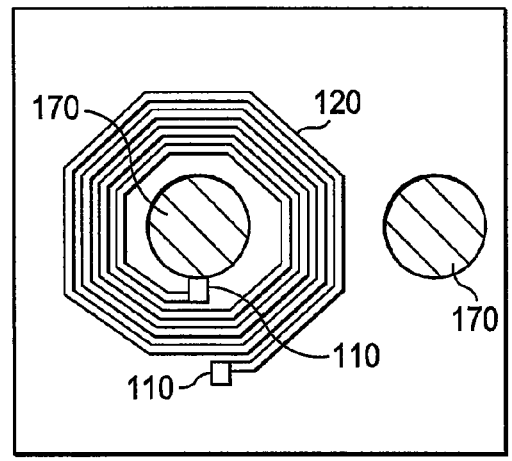
Figure 9E:
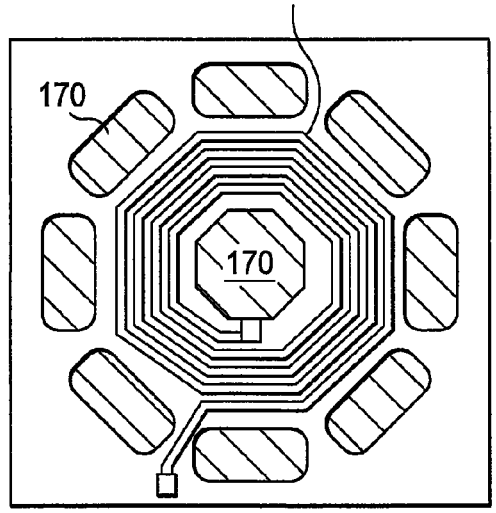
Figure 9F:
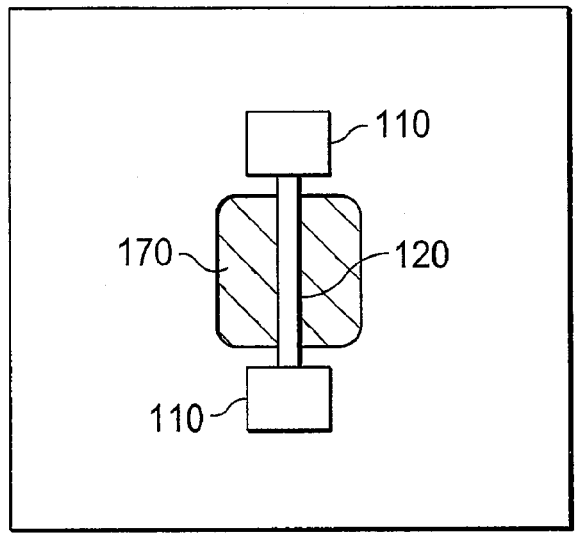

FIG. 9, which includes FIGS. 9a-9f, illustrates the top view of the semiconductor device after filling the trenches with a magnetic fill material. FIGS. 9a-9d illustrate top views that correspond to the cross sectional embodiment of FIG. 8a, whereas FIG. 9e-9f illustrate top views that correspond to the cross sectional embodiment of FIG. 8b.

FIG. 9a illustrates the top view of the linear first inductor coil 120 as illustrated in FIG. 6a after filling the trenches 160 with a magnetic fill material 170. FIG. 9b illustrates the top view of the circular first inductor coil 120 as illustrated in FIG. 6b after filling the trenches 160 with a magnetic fill material 170. FIGS. 9c, 9d, and 9e illustrate a top view of the concentric first inductor coil 120 as illustrated in FIGS. 6c, 6d, and 6e after filling the trenches 160 with a magnetic fill material 170. FIG. 9d illustrates the embodiment having the additional side trench filled with the magnetic fill material 170.

Figure 9G:
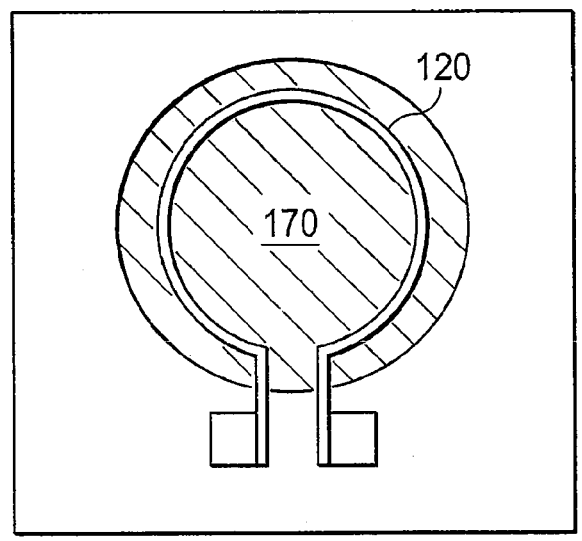

FIGS. 9f and 9g illustrate alternative embodiments of top views of the semiconductor device that correspond to the cross sectional view of FIG. 8b after filling the trenches 160 with a magnetic fill material 170.

Figure 10A:
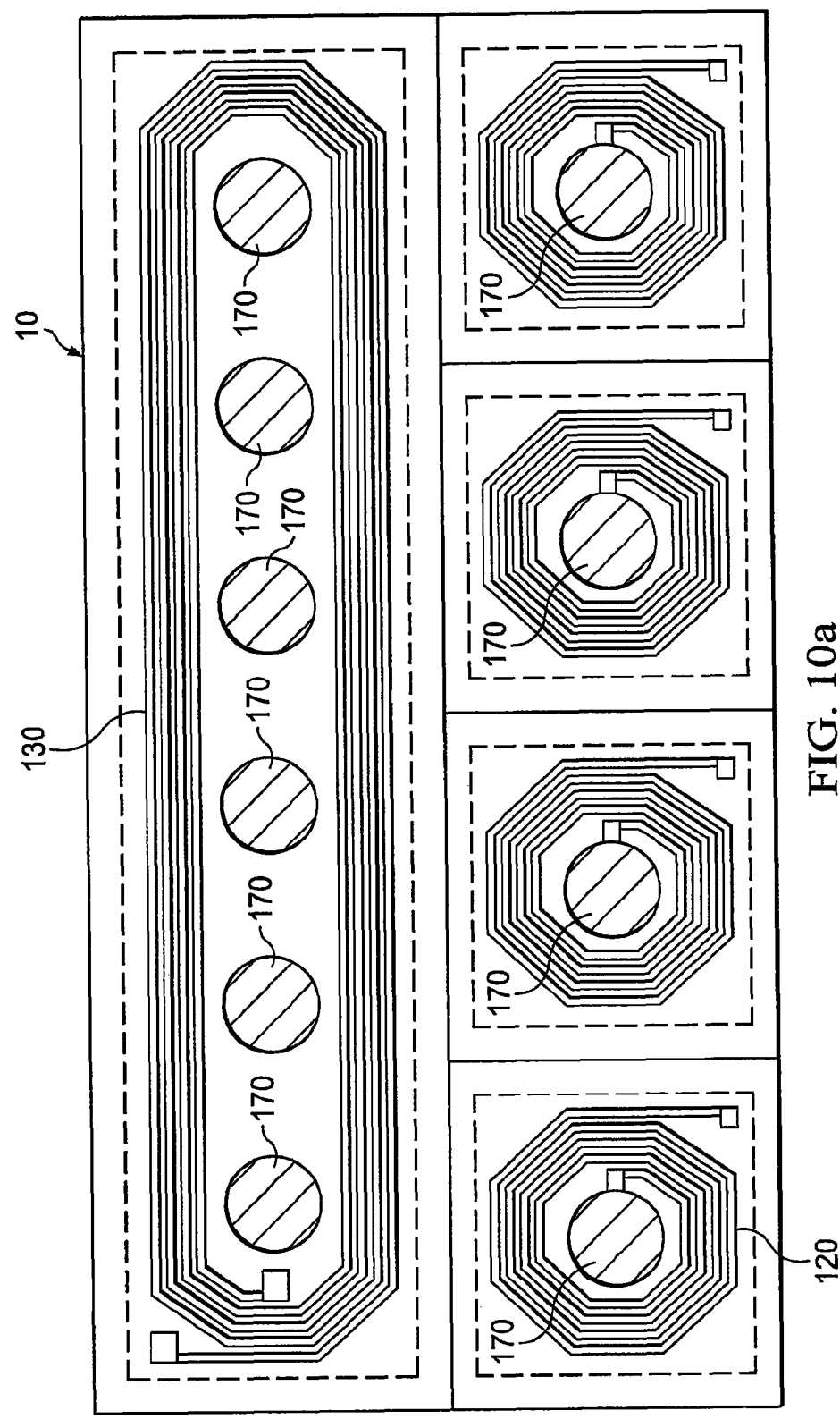
FIGS. 10*a*-10*d*, illustrate alternative embodiments showing transformers after filling the trenches with a magnetic fill material, wherein FIGS. 10*a*-10*d* correspond to the cross sectional view of FIG. 8*c*-8*e*.
Figure 10B:
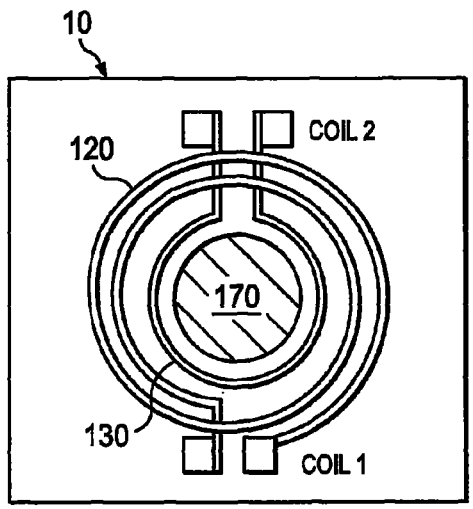
Figure 10C:
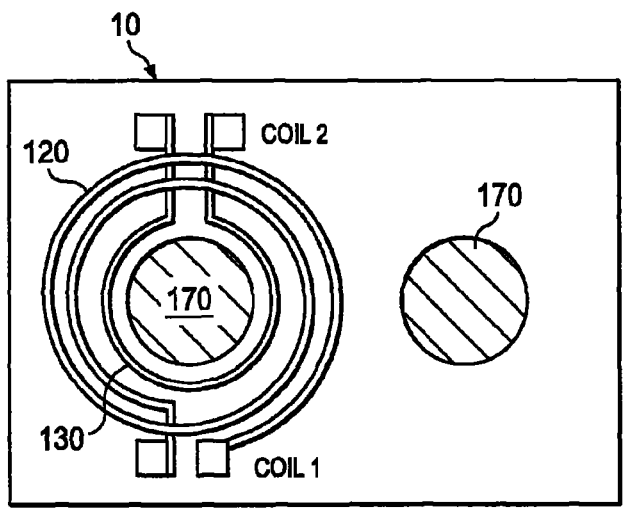
Figure 10D:
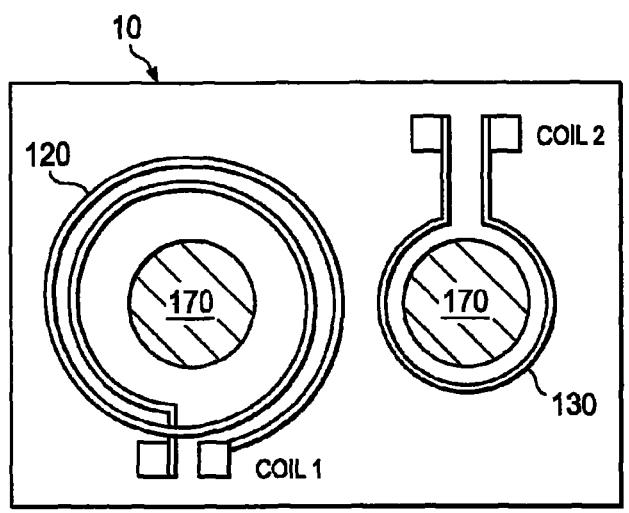

FIG. 10, which includes FIGS. 10a-10c, illustrate alternative embodiments showing transformers 10 after filling the trenches 160 with a magnetic fill material 170. FIGS. 10a-10c correspond to the cross sectional view of FIG. 8a.

Figure 11A:
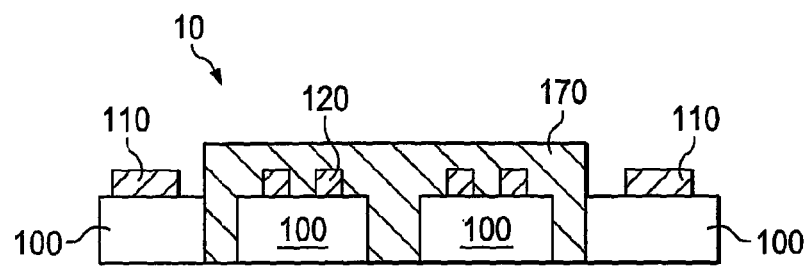
Figure 11B:
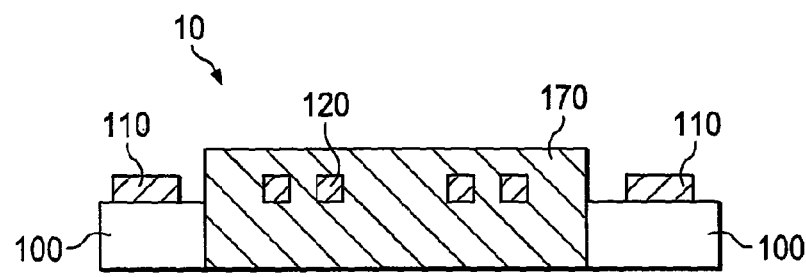

FIG. 11, which includes FIGS. 11a and 11b, illustrate the next stage of processing illustrating cross sectional views of the semiconductor device after thinning the substrate, wherein FIG. 11a illustrates the embodiment wherein the magnetic fill material is formed adjacent and over, and wherein FIG. 11b illustrates the embodiment in which the inductor coils are embedded within the magnetic fill material.

The substrate 100 is thinned from the back side to expose the magnetic fill material 170. The typical thickness of the substrate 100 after the thinning is about 30 μm to about 380 μm. In different embodiments, the thinning may be performed chemically and/or mechanically. In one or more embodiments, the thinning may be performed by a grinding process. In an alternative embodiment, a plasma etch may be used to thin the substrate 100 from the back side.

Figure 12A:
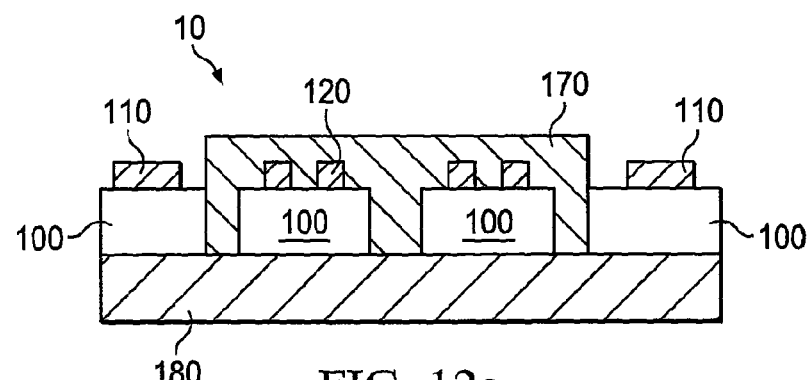
FIGS. 12*a* and 12*b*, illustrates the next stage of processing illustrating cross sectional views of the semiconductor device following formation of a backside magnetic layer.
Figure 12B:
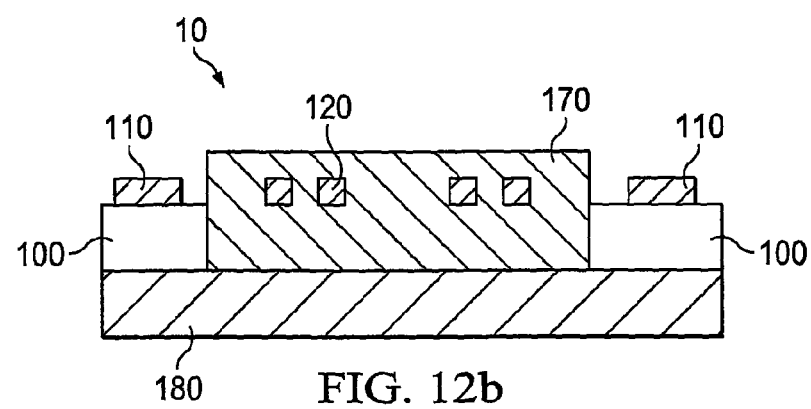

FIG. 12, which includes FIGS. 12a and 12b; illustrates an embodiment following formation of a backside magnetic layer 180. In one embodiment, the backside magnetic layer 180 is deposited over the back surface of the thinned substrate 100.

In various embodiments, the backside magnetic layer 180 comprises a ferromagnetic or ferrimagnetic material including iron, nickel, MnZn ferrite, NiZn ferrite, NiFe ferrite, NiCuZn alloy, mu-metals, and combinations thereof.

In one embodiment, the backside magnetic layer 180 is the same material as the magnetic fill material 170. In one or more embodiments, the backside magnetic layer 180 is a different material than the magnetic fill material 170. In one or more embodiments, a magnetic paste is applied to the front side of the substrate 100 while a magnetic foil is laminated over the back side of the substrate 100. In one embodiment, a same magnetic material is used in the magnetic paste and the magnetic foil.

Figure 13A:
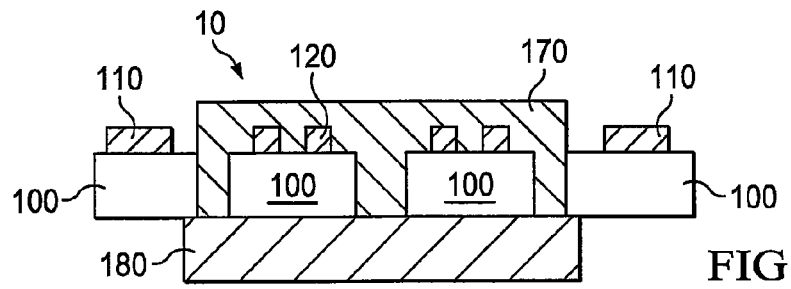
FIGS. 13*a* and 13*b*, illustrates an alternative embodiment of forming the backside magnetic layer.
Figure 13B:
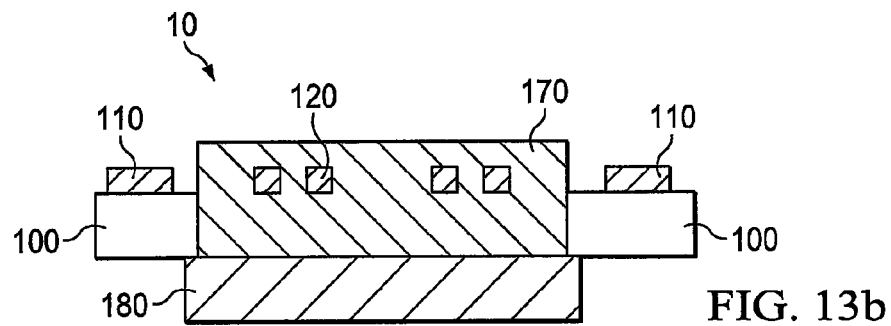

FIG. 13, which includes FIGS. 13a and 13b, illustrates an alternative embodiment of forming the backside magnetic layer.

As illustrated in FIGS. 13a and 13b, the backside magnetic layer 180 is formed only under the first inductor coil 120. Thereby remaining areas under the substrate 100 are not covered with the backside magnetic layer 180. This enables seamless integration of other components in the substrate 100. For example, the substrate 100 may include other devices such as transistors, capacitors, diodes, resistors etc., whose performance may be negatively impacted by the presence of a magnetic material. The patterned backside magnetic layer 180 may be formed, in one embodiment, by depositing a layer of the backside magnetic layer 180 and patterning using lithography.

Alternatively, the patterned backside magnetic layer 180 may be formed directly by techniques such as pattern plating, stencil printing, screen printing, ink-jet printing or other suitable printing technologies. In one embodiment, magnetic particles may be dispersed in a suitable liquid or solvent to form a paste. The paste may be applied to the backside of the substrate 100 using, e.g., stencil printing, screen printing, ink-jet printing or other suitable printing technologies. After the application of the paste, the paste may be exposed to thermal energy (e.g., elevated temperature, etc). This thermal energy causes the liquid in the paste to evaporate. Furthermore, the applied elevated temperature may be lower than the melting temperature of the magnetic material (in bulk form) of which the magnetic particles are made. Due to the temperature step, the magnetic particles may sinter and may thus form the patterned backside magnetic layer 180.

Figure 14A:
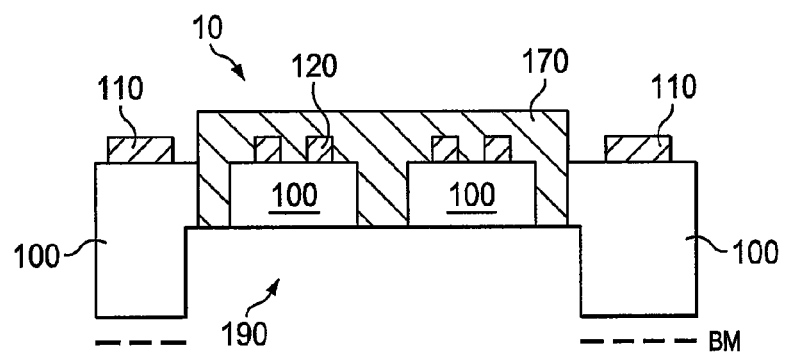
FIGS. 14 and 15 illustrate an alternative embodiment for forming a patterned backside magnetic layer, wherein FIG. 14, which includes 14*a* and 14*b*, illustrates the semiconductor device after locally etching a portion of the substrate to form a backside opening, and wherein FIG. 15, which includes 15*a* and 15*b*, illustrates filling the backside opening with a backside magnetic layer.
Figure 14B:
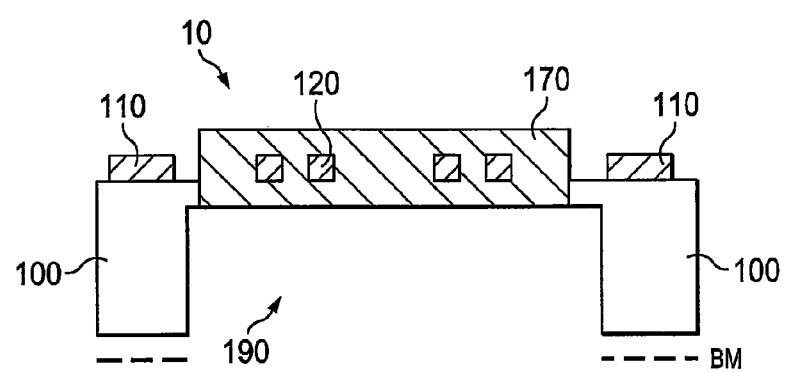
Figure 15A:
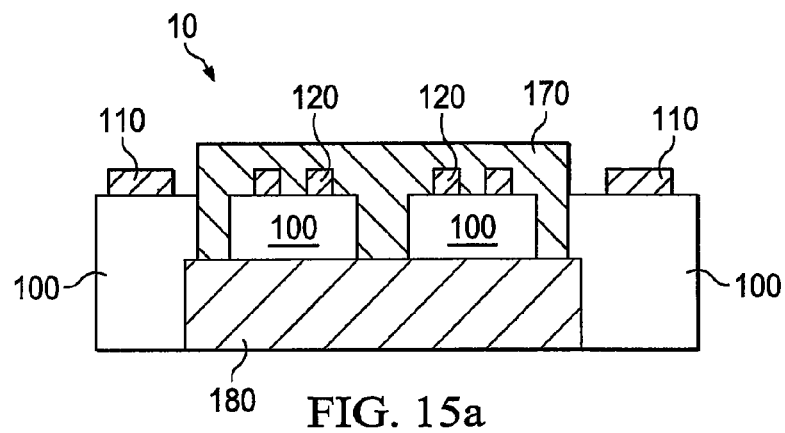
Figure 15B:
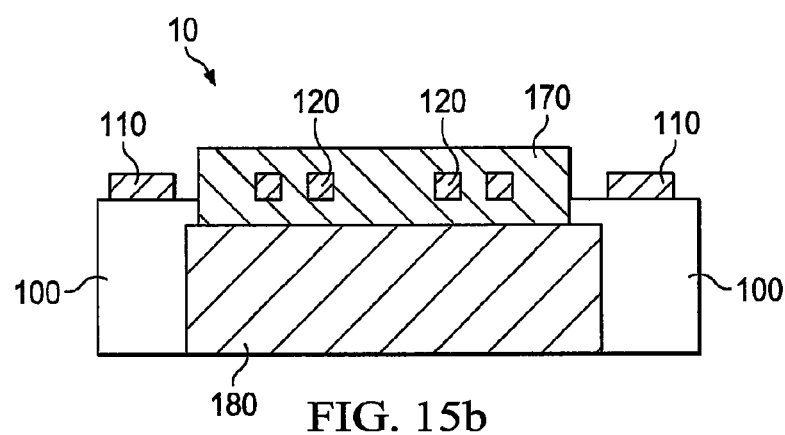

FIGS. 14 and 15 illustrate an alternative embodiment for forming a patterned backside magnetic layer.

FIG. 14, which includes 14a and 14b, illustrates an embodiment after locally etching a portion of the substrate to form a backside opening.

Referring to FIGS. 14a and 14b, after forming a mask, protecting remaining areas of the substrate 100 (e.g., after forming a hard mask layer (not shown) using backside mask BM), the area of the substrate 100 is etched anisotropically. A backside opening 190 thereby formed after the etching, which exposes the magnetic fill material 170. The etching thins the substrate 100 locally under the first inductor coil 120 without thinning the remaining areas. In one or more embodiments, the etching process is performed after thinning the substrate 100 globally.

FIG. 15, which includes 15a and 15b, illustrates filling the backside opening 190 with a backside magnetic layer 180. The backside magnetic layer 180 is formed located within the opening 190 by techniques such as pattern plating, stencil printing, screen printing, ink-jet printing or other suitable printing technologies. Alternatively, in one embodiment, the patterned backside magnetic layer 180 may be formed by a combination of a blanket deposition process followed by a planarizing process.

FIG. 16, which includes FIGS. 16a-16d, illustrates a semiconductor device in accordance with embodiments of the invention.

Figure 16A:
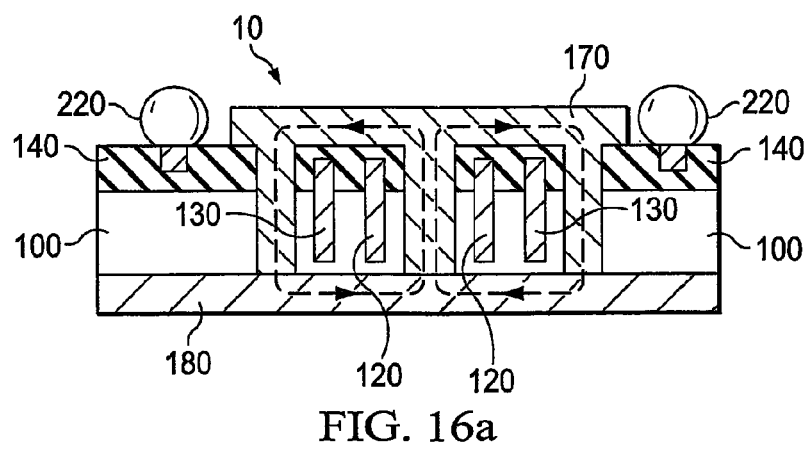
FIGS. 16*a*-16*d*, illustrates a semiconductor device in accordance with structural embodiments of the invention.

FIG. 16a illustrates a wafer level ball grid array (WLB) semiconductor package.

Referring to FIG. 16a, the semiconductor device comprises a first inductor coil 120 and a second inductor coil 130 forming a transformer 10. The WLB package comprises solder ball contacts 220 disposed over the top side of the substrate 100. The solder ball contacts 220 may be positioned in an array comprising shapes such as a square or rectangle, or an array in a central region. The solder ball contacts 220 may also be positioned in rows at a perimeter region. The input/output of the transformer 10 are coupled to input and output voltage node through the solder ball contacts 220. As illustrated in FIG. 16a, the backside magnetic layer 180 is formed on substantially the entire back surface of the chip. The closed magnetic loop formed within the inductor is shown by arrows.

Figure 16B:
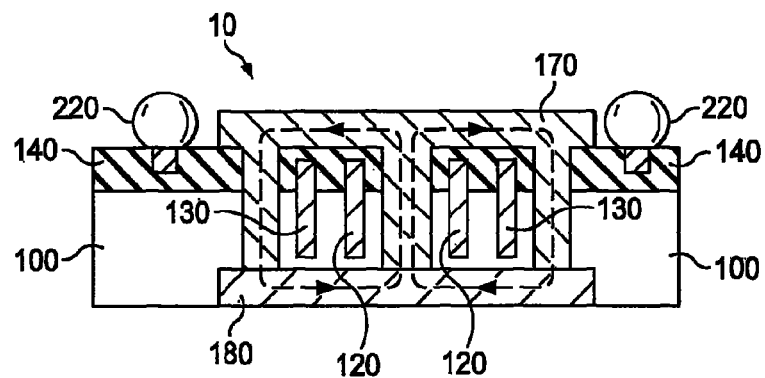

FIG. 16b illustrates an alternative embodiment of the WLB package wherein the backside magnetic layer 180 is formed locally primarily under the transformer 10. This allows formation of other components on the chip without minimal negative impact from the magnetic materials of the transformer 10. Again, the closed magnetic loop formed within the inductor is shown by arrows.

Figure 16C:
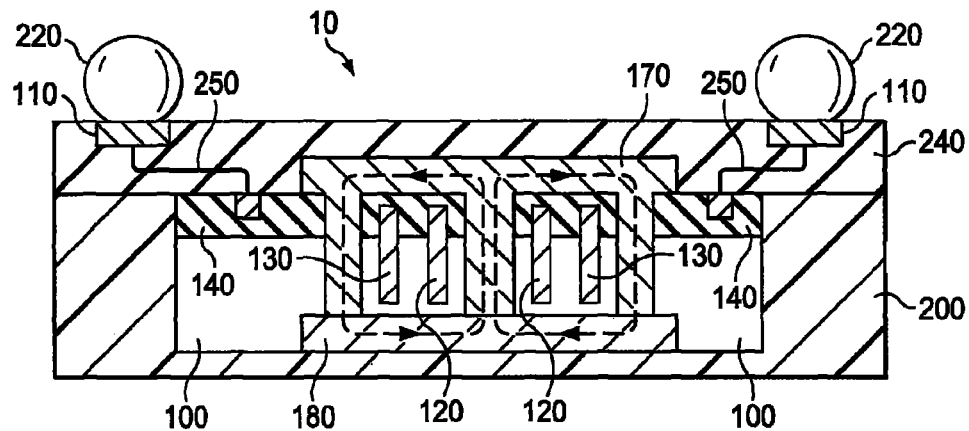

FIG. 16c illustrates an embodiment of the embedded wafer level ball grid array (eWLB) package. eWLB enables higher integration level and a greater number of external contacts. The transformer 10 in this embodiment is surrounded by a mold compound 200. The contact pads 110 may be formed in a redistribution insulating layer 240 and may include redistribution lines 250.

Figure 16D:
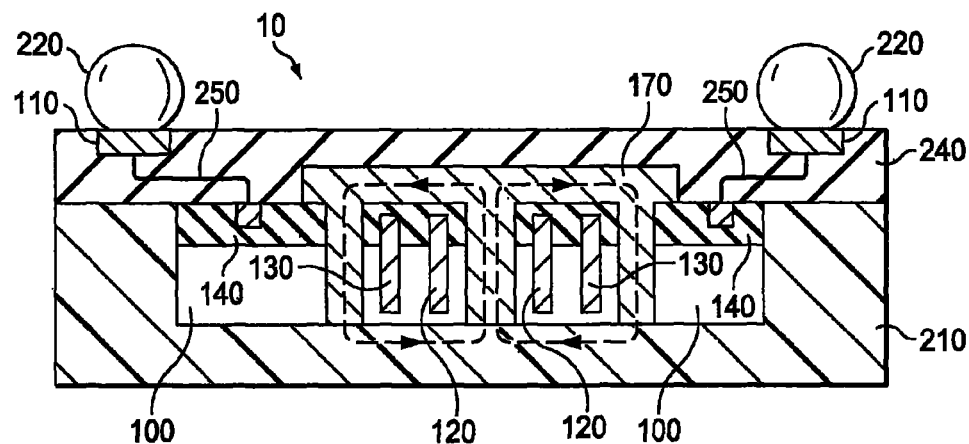

FIG. 16d illustrates an embodiment of the embedded wafer level ball grid array eWLB package including a magnetic mold compound. As illustrated in FIG. 16d, a magnetic mold compound 210 surrounds the substrate 100. A portion of the magnetic mold compound 210 along with the magnetic fill material 170 forms the core of the first and the second inductor coils 120 and 130 forming the transformer 10. Unlike the prior embodiment of FIG. 16c, the mold compound forming the eWLB package is a magnetic material in this embodiment.

The magnetic mold compound 210 comprises magnetic particles embedded within an epoxy mold compound in one embodiment. In various embodiments, ferromagnetic or ferrimagnetic particles including iron, nickel, MnZn ferrite, NiZn ferrite, NiFe ferrite, NiCuZn alloy, mu-metals, or combinations thereof may be disposed within the magnetic mold compound 210.

FIG. 17, which includes FIGS. 17a-17e, illustrates a semiconductor device in various stages of processing in accordance with an embodiment of the invention.

Figure 17A:
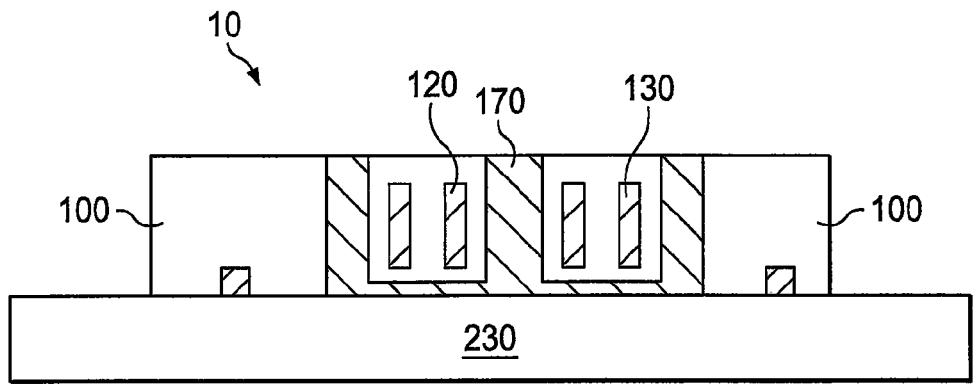
FIGS. 17*a*-17*e*, illustrates a semiconductor device in various stages of processing in accordance with an embodiment of the invention.

In this embodiment, an eWLB package is fabricated in which the mold compound forms part of the magnetic core of the inductor coils. This embodiment follows the processing described with respect to FIG. 2-10. Referring to FIG. 17a, after filling in the trenches 160 with a magnetic fill material 170, the substrate 100 may be thinned. The substrate 100 may be placed on a carrier 230 for mechanical support during subsequent processing. In particular, the top surface of the substrate 100 (having e.g., the active devices) is placed on the carrier 230.

Figure 17B:
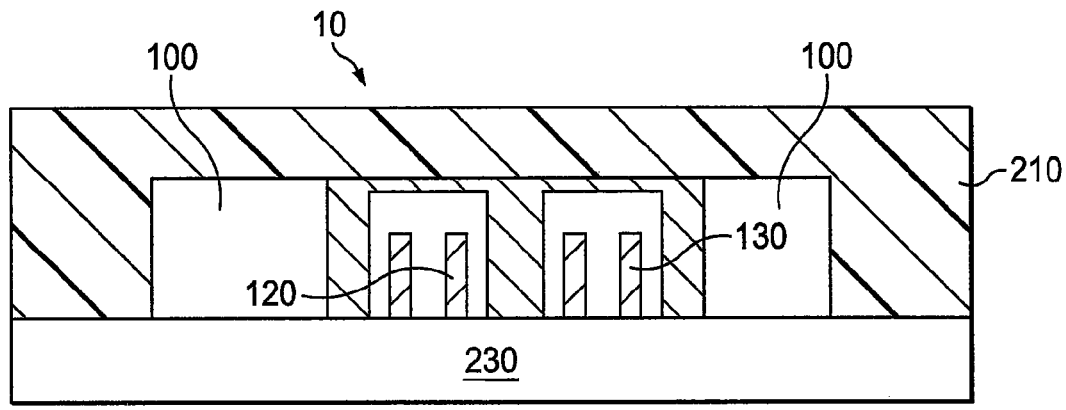

The carrier 230 may be a glass substrate or a aluminum substrate that provides mechanical support and thermally stable during processing. Referring next to FIG. 17b, the substrate 100 is encapsulated with a magnetic mold compound 210.

In one embodiment, a nanopaste comprising magnetic particles is applied over the substrate 100. The nanopaste may be cured, e.g., by performing a thermal anneal. After curing, the magnetic mold compound 210 surrounds the substrate 100 as illustrated in FIG. 17b.

Figure 17C:
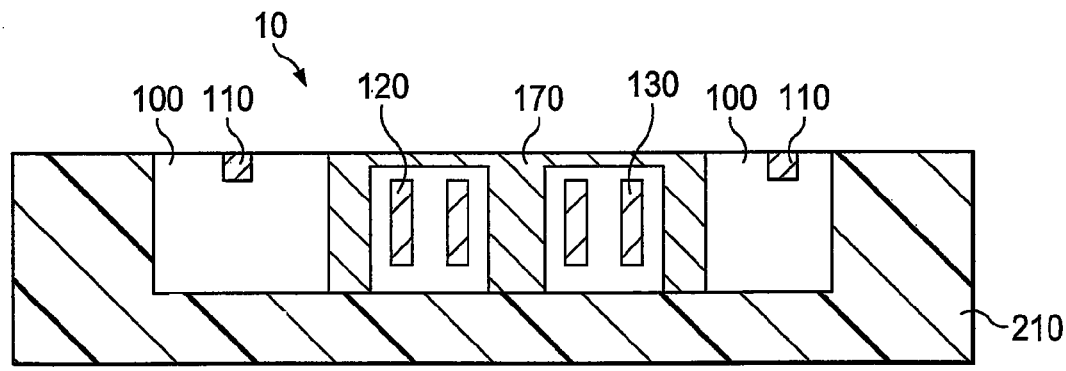
Figure 17D:
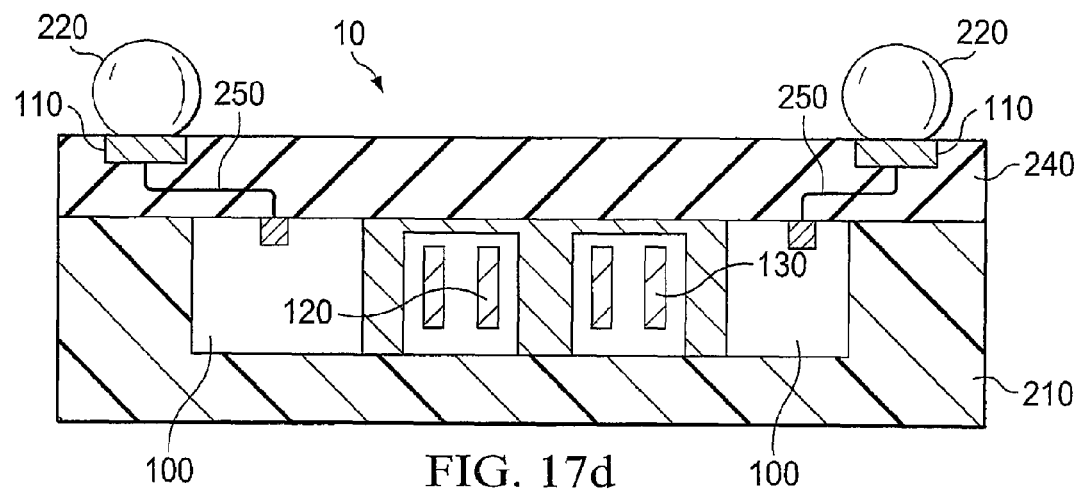
Figure 17E:
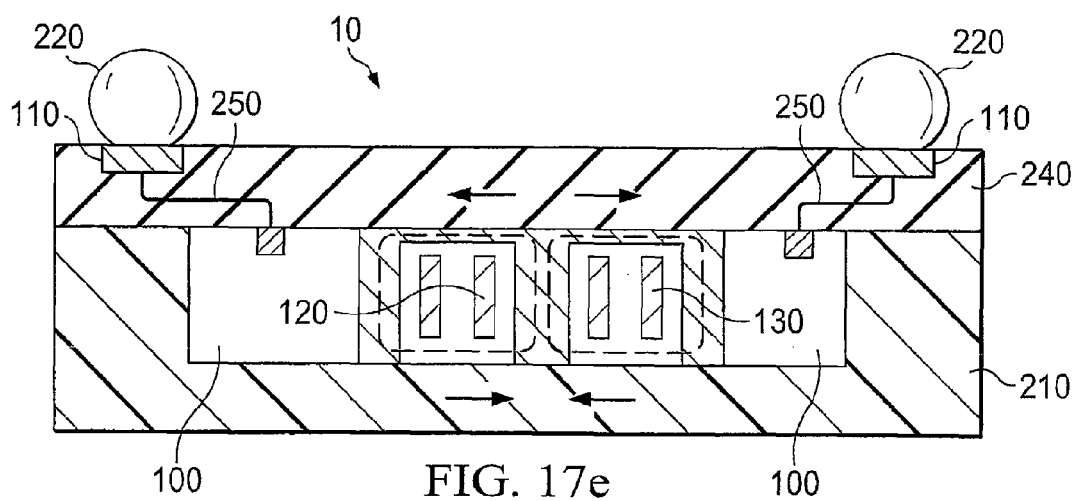

Referring next to FIG. 17c, the carrier 230 is removed and substrate is turned over bringing the top surface of the substrate 100 to face upwards (on the plane of paper).

Next, a redistribution layer is formed over the top side of the substrate 100. Redistribution lines 250 may be formed within a redistribution insulating layer 240. The redistribution lines 250 comprising copper may be formed by electroplating over a seed layer in one embodiment. Solder ball contacts 220 may next be formed over the redistribution layer for coupling the components of the chip to external input/outputs.

Next, the substrate 100 is singulated separating the chips on the wafer into individual chips. Singulation may be performed mechanically using, for example, a dicing tool.

While not described individually, embodiments of the invention also include applications of inductive coils including micro-machines such as actuators. Common examples of micro-electromechanical systems (MEMS) actuators include micro-motors.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor device, the method comprising:
    forming a first inductor coil within and/or over a substrate, the first inductor coil formed adjacent a top side of the substrate, wherein metal lines of the first inductor coil are formed in a plurality of metal levels over the substrate;
    forming first trenches within the substrate adjacent the first inductor coil;
    filling the first trenches at least partially with a magnetic fill material;
    thinning at least a first portion of the substrate underlying the first inductor coil; and
    forming a backside magnetic layer under the first portion of the substrate, wherein the backside magnetic layer and the magnetic fill material form at least a part of a magnetic core region of the first inductor coil.

2. The method of claim 1, wherein the first trenches are formed around the first inductor coil.

3. The method of claim 1, wherein the first inductor coil surrounds at least one trench of the first trenches.

4. The method of claim 1, wherein forming first trenches within the substrate adjacent the first inductor coil comprises laterally etching portions of the substrate between adjacent trenches.

5. The method of claim 1, wherein thinning at least a first portion of the substrate underlying the first inductor coil comprises globally thinning the substrate from a backside of the substrate, the backside being opposite to the top side.

6. The method of claim 1, wherein thinning at least a first portion of the substrate underlying the first inductor coil comprises etching a backside opening underneath the first inductor coil, and wherein forming a backside magnetic layer comprises filling the backside opening with the backside magnetic layer.

7. The method of claim 1, wherein the magnetic fill material and the backside magnetic layer comprise a ferromagnetic or ferrimagnetic material.

8. The method of claim 1, wherein the magnetic fill material comprises a material selected from the group consisting of MnZn ferrite, NiZn ferrite, NiFe ferrite, NiCuZn alloy, mu-metals, iron, nickel, and combinations thereof.

9. The method of claim 1, further comprising:
    forming a second inductor coil within and/or over the substrate, the second inductor coil formed adjacent the top side of the substrate, wherein the second inductor coil is formed adjacent the first inductor coil;
    forming second trenches within the substrate adjacent the second inductor coil;
    filling the second trenches at least partially with the magnetic fill material;
    thinning at least a second portion of the substrate underlying the first inductor coil; and
    forming the backside magnetic layer under the second portion of the substrate, wherein the backside magnetic layer and the magnetic fill material form at least a part of a magnetic core region of the second inductor coil.

10. The method of claim 5, wherein forming a backside magnetic layer comprises depositing a blanket layer of the backside magnetic layer under the backside of the substrate.

11. The method of claim 5, wherein forming a backside magnetic layer comprises filling in a mold compound comprising magnetic particles.

12. The method of claim 5, wherein forming a backside magnetic layer comprises forming the backside magnetic layer locally underneath the first inductor coil.

13. A method of forming a semiconductor device, the method comprising:
    forming a first inductor coil within and/or over a substrate, the first inductor coil formed adjacent a top side of the substrate, wherein metal lines of the first inductor coil are formed in a plurality of metal levels over the substrate;
    forming first trenches within the substrate adjacent the first inductor coil;
    filling the first trenches with a magnetic fill material;
    attaching a carrier to the top side of the substrate; and
    encapsulating the substrate and the first inductor coil with a magnetic mold compound.

14. The method of claim 13, wherein the magnetic mold compound and the magnetic fill material form at least a part of a magnetic core region of the first inductor coil.

15. The method of claim 13, wherein the first trenches are formed around the first inductor coil.

16. The method of claim 13, wherein the first inductor coil surrounds at least one trench of the first trenches.

17. The method of claim 13, wherein the magnetic mold compound comprises magnetic particles comprising a material selected from the group consisting of MnZn ferrite, NiZn ferrite, NiFe ferrite, NiCuZn alloy, mu-metals, iron, nickel, and combinations thereof, and wherein the magnetic fill material comprises a material selected from the group consisting of MnZn ferrite, NiZn ferrite, NiFe ferrite, NiCuZn alloy, mu-metals, iron, nickel, and combinations thereof.

18. The method of claim 13, further comprising:
   thinning the substrate before attaching the carrier;
   separating the carrier from the encapsulated substrate and the first inductor coil; and
   singulating the encapsulated substrate and the first inductor coil into individual chips after separating the carrier.

19. A method of forming a semiconductor device comprising:
   forming metal lines of a first inductor coil within and/or over a substrate, the metal lines disposed adjacent a top side of the substrate than an opposite back side, wherein the metal lines of the first inductor coil are formed in a plurality of metal levels over the substrate;
   forming first trenches within the substrate adjacent the first inductor coil;
   at least partially filling the first trenches with a magnetic fill material; and
   forming a magnetic material under a first portion of the substrate, wherein at least a part of a magnetic core region of the first inductor coil comprises the magnetic material and the magnetic fill material.

20. The method of claim 19, wherein the first trenches are formed around the first inductor coil.

21. The method of claim 19, wherein the first inductor coil surrounds at least one trench of the first trenches.

22. The method of claim 19, wherein the magnetic material is formed under substantially the entire back side of the substrate.

23. The method of claim 19, wherein the magnetic material comprises a mold compound comprising magnetic particles.

24. The method of claim 19, further comprising forming an embedded wafer level ball grid array (eWLB) package.

25. The method of claim 19, further comprising injection molding to form an injection molded package.

26. The method of claim 23, wherein forming the magnetic material under the first portion of the substrate comprises encapsulating the substrate with the magnetic material.

27. The method of claim 26, further comprising forming a wafer level ball grid array (eWLB) package.

* * * * *